United States Patent [19]
Hanna et al.

[11] 3,770,967
[45] Nov. 6, 1973

[54] FIELD EFFECT TRANSISTOR DETECTOR AMPLIFIER CELL AND CIRCUIT PROVIDING A DIGITAL OUTPUT AND/OR INDEPENDENT OF BACKGROUND

[75] Inventors: Robert W. Hanna, Sterling; John J. Hession, Manassas, both of Va.

[73] Assignee: International Business Machines Corporation, Armonk, N.Y.

[22] Filed: Feb. 24, 1972

[21] Appl. No.: 229,137

[52] U.S. Cl. .......... 250/214 R, 250/206, 250/211 J, 307/311
[51] Int. Cl. .......... H01j 39/12
[58] Field of Search .......... 250/206, 214, 219 D, 250/219 DC, 211 J; 307/311, 317

[56] References Cited

UNITED STATES PATENTS

| | | | |
|---|---|---|---|
| 3,534,280 | 10/1970 | Biard et al. | 330/24 |
| 3,321,637 | 5/1967 | Beltz et al. | 250/219 DC |
| 3,463,928 | 8/1969 | Murphy | 250/214 A |
| 3,390,273 | 6/1968 | Weckler | 250/206 X |
| 3,333,106 | 7/1967 | Fischer | 250/214 R |
| 3,308,276 | 3/1967 | Panagiotov et al. | 250/219 DC X |
| 3,535,532 | 10/1970 | Merryman | 250/211 J X |

OTHER PUBLICATIONS

Hession et al.; IBM Technical Disclosure Bulletin; Vol. 13; No. 9; 2/71; pg. 2822.
Weinberger; IBM Technical Disclosure Bulletin; Vol. 11, No. 1; 6/68; pg. 26.
Noble: IEE Transactions on Electron Devices, Vol. ED–IJ; No. 4, April, 1968, pp. 202–209.

*Primary Examiner*—Walter Stolwein
*Attorney*—Joseph C. Redmond, Jr. et al.

[57] ABSTRACT

A light sensitive element, typically a photo-transistor, diode or the like, is suitably coupled to a load element, typically an FET device suitably biased as a linear load. An output circuit including a high input impedance element, typically an FET inverter, is coupled between the linear load and the diode. Little or no current flows in the input circuit in the absence of light applied to the light sensitive element. When light is applied current flows through the light sensitive element and modulates current flow through the inverter. The output circuit has high sensitivity to low level light signals by reason of the linear load and the absence of "Johnson" or thermal noise. A suitable connection between the light sensitive element and the load element sets the output circuit in a threshold state for immediate response to light signals. Connecting the inverter output to suitable circuitry, i.e., amplifiers, differential amplifiers, level shifters and the like, provides an analog or digital output sensitive to extremely low light levels.

11 Claims, 9 Drawing Figures

FIELD EFFECT TRANSISTOR DETECTOR AMPLIFIER CELL AND CIRCUIT PROVIDING A DIGITAL OUTPUT AND/OR INDEPENDENT OF BACKGROUND

BACKGROUND OF THE INVENTION a. Field of the Invention

This invention relates to integrated semiconductor devices and circuits. More particularly, the invention relates to light sensitive integrated devices and circuits that provide a digital or analog output signal for an analog input signal. Additionally, the invention relates to field effect transistor detector amplifiers cells and circuits.

b. Description of the Prior Art

Light sensitive devices and circuits find application in many information handling apparatus, typically document reading equipment and the like. Integrated light sensitive amplifiers and detectors are particularly desirable for such apparatus. Integrated elements are relatively inexpensive, efficient, compact and may be readily assembled into complex apparatus. Present integrated light sensitive devices require high light levels, i.e., of the order of milli or microwatts in document reading equipment. The high light levels demand the equipment process documents at high speeds to prevent burn up of the light sensitive elements. Additionally, present devices operate in a non-linear and non-threshold mode which precludes effective determination of the presence or absence of a character in the document being scanned. Generally, present-day detector circuits are individually set according to the presence or absence of a character in the document. The individual setting of detector circuits rendering the equipment subject to erroneous signals, particularly as the color of the document changes or the light source diminishes in strength from age or voltage or the like.

SUMMARY OF THE INVENTION

An object of the invention is an integrated light sensitive element and circuit responsive to relatively low light signals of the order of nanowatts.

Another object is a light sensitive integrated circuit that provides an output independent of the background.

Another object is a light sensitive detector amplifier cell that has linear operation and is highly sensitive to relatively low level light signals.

Another object is a field effect transistor detector amplifier cell and circuit adapted for threshold response to light signals, regardless of the background in which the light is detected.

In one form, a light sensitive element, photo transistor or diode is connected in a reverse biased condition between a voltage supply at one terminal and to an amplifying element at the other terminal. The amplifier serves as a load and is biased for linear operation. An output circuit including a high input impedance element is connected to an output node between the diode and amplifier. Typically, the high impedance element is an FET inverter with its gate circuit connected to the output node. However, other circuit connections and elements may be substituted. In the absence of light, very little current flows through the linear amplifier and reverse biased diode. The photo diode sets the amplifier in a threshold state. When light shines, current immediately flows through the light sensitive element and modulates the inverter current. The current flow is analogous to the light falling on the diode since little to no noise current flows to the high input impedance inverter. The linear load and its threshold operation permit light levels of the order of nanowatts to be detected and quantified, if desired.

In another form, a buffer amplifier may be connected between the light sensitive element and the linear load element. The buffer amplifier further reduces the cell optical response time and increases the cell threshold sensitivity.

In still another form, the inverter may be connected as one leg of a differential amplifier. In the absence of light, current flows evenly through both legs. When light is present, current flows unevenly through each leg of the differential amplifier. The differential output is directly proportional to the quantity of light incident on the photo device.

In still another form, the light sensitive element, linear load impedance and inverter may be adapted to provide a digital signal indicative of the presence or absence of light on the photo device.

In still another form, the circuit may be further adapted to have low standby power and follow the background contrast level.

DESCRIPTION OF THE PREFERRED EMBODIMENT

Figure 1A:
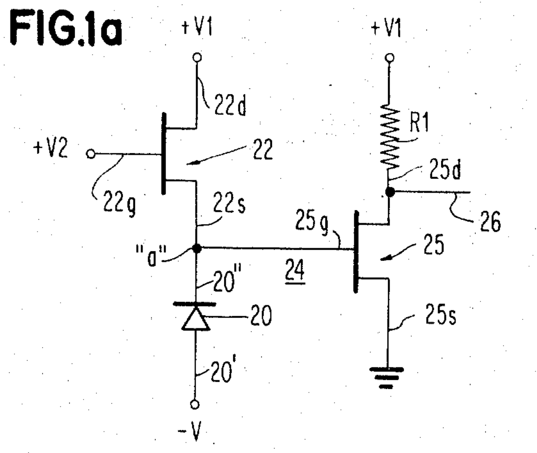
FIG. 1*a* is an electrical schematic of the circuit of the present invention.
Figure 6A:
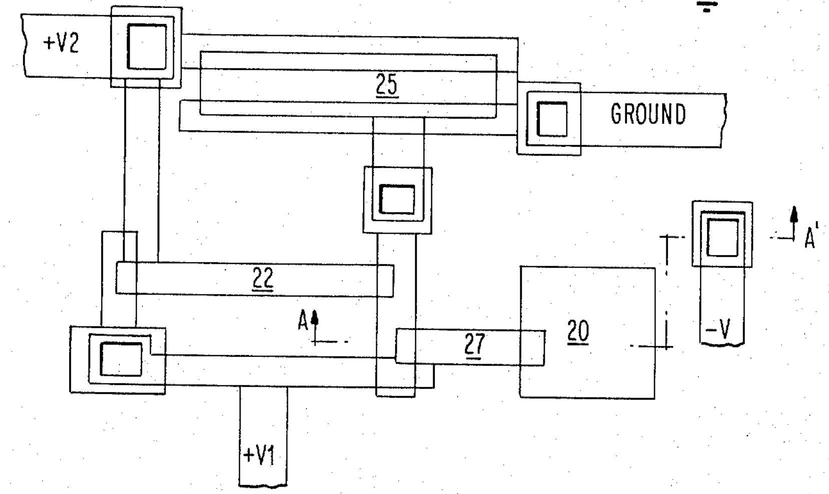
FIG. 6*a* is a plan view of a semiconductor device including the circuitry of FIG. 2.
Figure 6B:
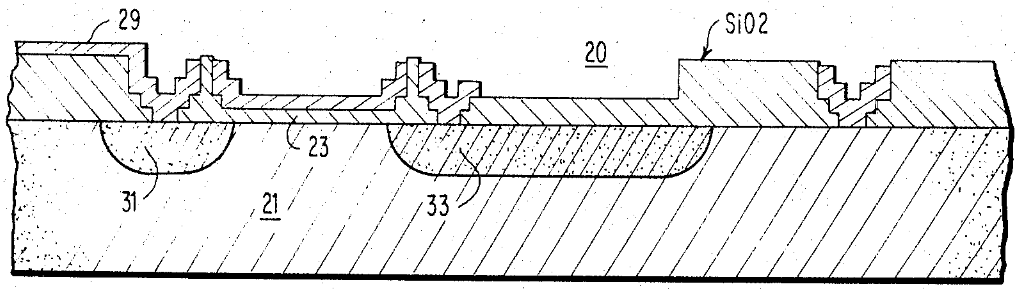
FIG. 6*b* is a cross section of the semiconductor device of FIG. 2 along line A—A'.

Referring to FIG. 1*a*, a light sensitive element 20, typically a photo transistor diode or the like and load element 22 are incorporated in a semiconductor member 21 (see FIG. 6*b*). The element 20 has an anode electrode 20' connected to a negative voltage supply (−V), typically of the order of 5–12 volts. A cathode electrode 22'' is connected to an electrode of the load element 22. The element 20 is normally biased to be in a reversed biased state. Typically, the device 20 has an area of 20 mils by 20 mils. The current flow through the device is of the order of 0.250 microamperes/per microwatt per centimeter squared.

The load element 22 is usually an amplifying element biased for linear operation. However, it should be noted that any load element that provides a linear characteristic may be employed. In one form, an FET device is utilized and biased for linear operation, as described for example, in U.S. Pat. No. 3,406,298, assigned to the same assignee as that of the present invention. The load element has an impedance of the order of 1 megohm, when connected at a drain electrode 22*a* to a positive voltage supply (+V1), typically of the order of 6–8 volts; a gate electrode 22*g* connected to a bias voltage (+V2) typically of the order of 8–9 volts and a source electrode 22*s* connected to the electrode 20''.

An output circuit 24 is connected to a node *a* between the device 20 and load 22. The circuit 24 includes a high input impedance element 25 of the order of 500 megohms. In one form, an FET inverter is utilized. It should be noted, however, that other elements may be substituted, as for example an FET source-follower with a high transconductance FET. Alternatively, the circuit may employ bipolar devices for FET devices if the element 25 is adapted to have a $\beta$ of the order of 4,000–5,000. The inverter 25 includes a load element R1, typically a resistor of the order of 1 kilohm. connected between the voltage supply V1 and a drain electrode 25*d*. A gate electrode 25*g* is connected to node *a*. A source electrode 25*s* is connected to a reference supply, typically ground. An output terminal 26 is connected to the electrode 25*d*. The inverter is normally conducting due to the voltage at node *a* which approaches the voltage +V1.

Figure 1B:
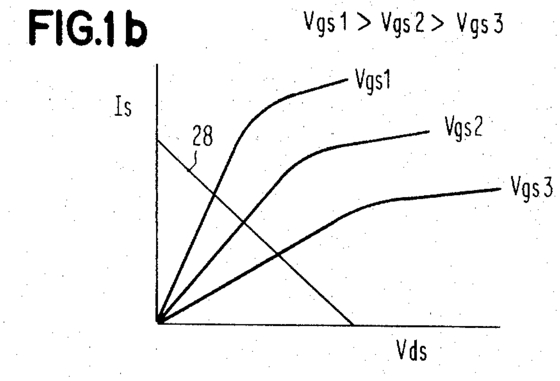
FIG. 1*b* is a graph of the transfer characteristic of the circuit of FIG. 1*a*.
Figure 1C:
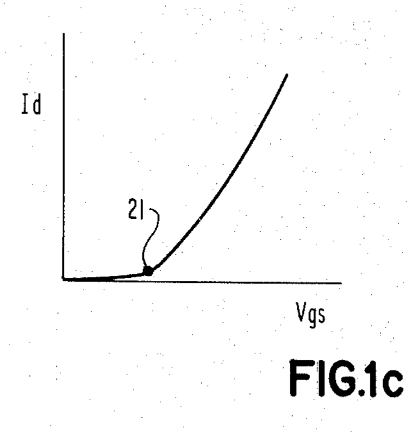
FIG. 1*c* is a graph of the operating state of a linear load element in the circuit of FIG. 1*a*.

Referring to the operating point of the linear by 22 is on a load line 28, shown in FIG. 1*b*, which extends through the linear portion of the device volt-ampere characteristic. The parameters of the volt-ampere characteristics are drain currents (I*d*) and drain-source voltage (V*ds*). A photo sensitive device 20 acts as a capacitor to provide a cathode level which places the linear load 22 near its threshold or conducting point, 21 as shown by the volt-ampere characteristic in FIG. 1*c*. The parameters in FIG. 1*c* are drain current (I*d*) versus gate-source voltage (V*gs*).

In operation, when no light is shining on reverse biased diode 20, only low current e.g., 10 nanoamperes flows in the linear load 22 due to leakage. As noted before, the high input impedance of the inverter 25 prevents the flow of current thereto. The cathode voltage at the electrode 20' sets the operating state of the linear load at its threshold point.

When light shines on the diode 20, inducing a higher current flow, e.g., of the order of 250 nanoampers the voltage fluctuation at the gate of 25 will be a function of the signal current through the linear load 20. All of the load voltage will be reflected across the gate-source of the inverter 25. No "Johnson" or thermal noise current flows in the circuitry because of the effect of high impedance of the inverter 25. "Johnson" or thermal noise is defined in the text Electronic Engineering, C. L. Alley and K. W. Atwood, John Willey & Sons, New York, N. Y., 2nd Ed., p. 373. Without a significant voltage drop due to Johnson noise current and with the linear load being in a threshold state, the reflected voltage at the gate of the inverter 25 is truly analogous to the light incident on the photo diode. The reflected voltage modulates the current in the inverter 25 which provides an output change at the terminal 26 of the order of 250 millivolts per microwatts of light per centimeter squared on the photocell. The sensitivity of the circuit is sufficient to permit light levels of the order of nanowatts to be detected.

Figure 2:
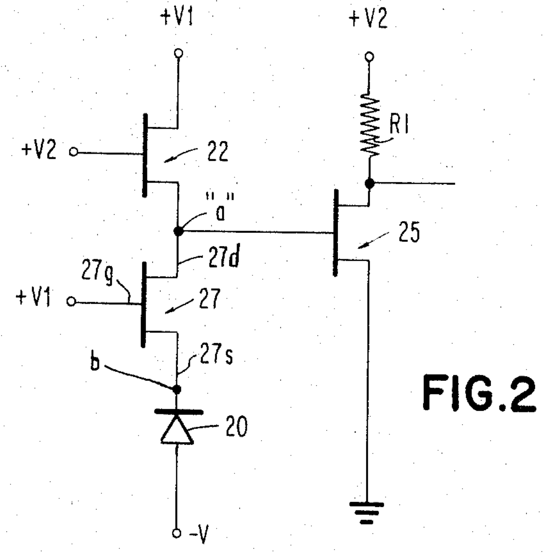
FIG. 2 is an electrical schematic of the circuit of FIG. 1*a* adapted to include a buffer amplifier.

An improvement in the circuit of FIG. 1*a* is shown in FIG. 2. Elements in FIG. 2, identical to those in FIG. 1*a*, have the same reference designation. A buffer amplifier 27 is incorporated in the circuit of FIG. 1*a* to further improve the cell optical response time and threshold sensitivity. The amplifier 27 is an FET device, although other active elements may be employed. The amplifier includes a drain electrode 27*d*, a gate electrode 27*g* and a source electrode 27*s*. The electrode 27*d* is connected to the node *a*. The electrode 27*g* is connected to a positive voltage supply of the order of 8 volts. The electrode 27s is connected to the electrode 20''. The photocell biases the device 27 near its threshold point in a manner similar to that described for the device 22 in FIG. 1*a*. Similarly, the bias voltage at the electrode 27*g* biases the device 22 near its threshold point. Essentially, the amplifier 27 is an impedance transformation device. The signal at node *a* can now be made much larger than the signal at node *b*, thus allowing the photocell to discharge a much smaller voltage signal with resulting improvement in response time of the circuit.

In the absence of light, very little current flows through the devices 22 and 27. The voltage at node *a* is approximately the voltage V1 at the gate electrode 27*g*. The node voltage appears across the electrode 25*g* causing current flow through the amplifier 25. When light shines on the element 20, current flows through the devices 22 and 27. The voltage at node *a* commences to fall which reduces the current in device 25. The resulting change in voltage at the terminal 26 will be independent of the threshold voltages of 22 and 27 because of the biasing aspect of the device 20 and bias voltage +V1 placing them near their threshold voltages. The magnitude of the voltage at the electrode 25*g* will be a complete result of the light directed on the element 20. All of the current flowing through the elements 22 and 27, generated by the turn on of element 20, will drop across their linear impedance and none will be lost as noise because of the high input impedance of the device 25. The circuit of FIG. 2 has a sensitivity of the order of 250 millivolts per microwatt but it will be about five times faster because of the buffering action.

Figure 3:
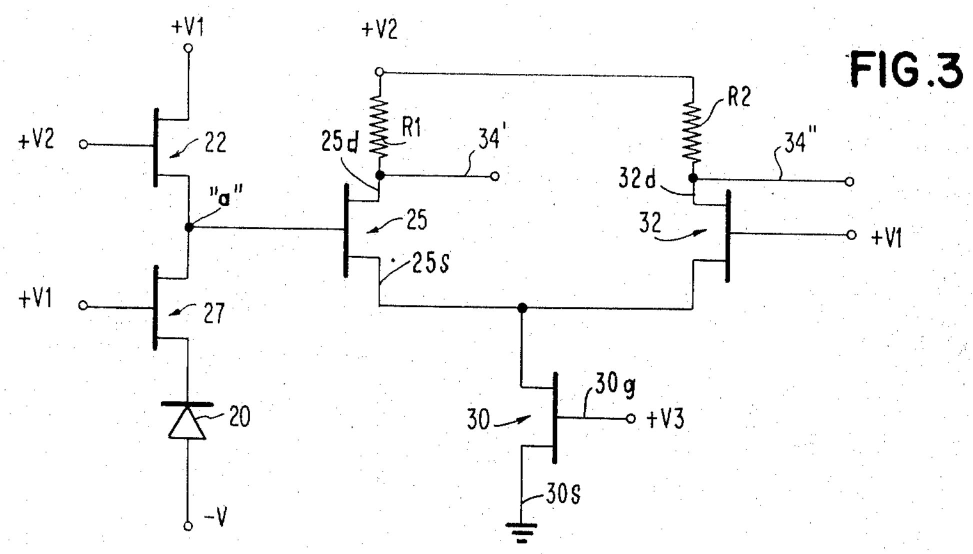
FIG. 3 is an electrical schematic of the circuit of FIG. 2 including a differential amplifier.

The inverter 25 may be incorporated into a differential amplifier circuit as shown in FIG. 3. Elements in FIG. 3 corresponding to those in FIGS. 1*a* or 2 have the same reference designation. A constant current source is provided in FIG. 3 by connecting a device 30 between the electrode 25*s* and a reference potential, typically ground. In one form, an FET device is employed as a part of the constant current source. A gate electrode 30*g* is connected to a voltage supply V3 of the order of 3 volts. A source electrode 30*s* is connected to the reference level. An amplifier 32 is coupled through a load resistor R2 to the voltage supply V2 and to the source 30 to complete the differential amplifier circuit. Outputs 34' and 34'' are taken from the drain electrodes of the elements 25 and 32, respectively.

When no light is shining on element 20, only low current flows in devices 22 and 27 and element 25 is in a conducting state causing current to flow from V2 through elements 25, 32 and 30. Device 25 and 32 will be well matched so their currents will share equally in the dark. When light shines on element 20, inducing a high current flow, the voltage at node *a* drops which reduces the current in element 25. Because of the common constant current source, element 30, the current in element 32 will increase by the same amount as the decrease in element 25. A differential output voltage appears between terminals 34′ and 34″ that is directly proportional to the incident light on the element 20. The circuit of FIG. 3 may be operated as a two-dimensional array when a word input is provided at the gate electrode 30*g* while sensing between the drain electrodes of 25*d* and 32*d*.

Figure 4:
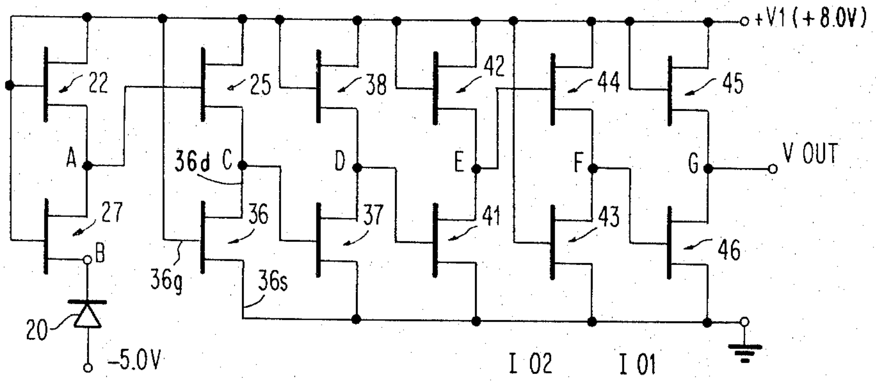
FIG. 4 is an electrical schematic of the circuit of FIG. 2 adapted to provide a digital output signal.

The circuit of FIG. 2 is combined with a series of inverter stages in FIG. 4, to provide a digital output signal for the analog signal generated by element 20. The digital signal is the presence or absence of a voltage level or one or zero or vice versa, depending upon the logic system selected. An amplifier 36 is connected in the source circuit of the amplifier 25. The amplifier 36 has a gate electrode 36*g* connected to the supply voltage V1, a source electrode 36*s* at a reference level, typically ground, and a drain electrode 36*d* connected to the electrode 25*s*. The elements 25 and 36 shifts the voltage level at point A to a lower level based upon the gate voltage at the device 36. Amplifiers 37 and 38 are biased such that point D is down and current is flowing in element 37 when no light is shining on the element 20. Amplifiers 41 and 42 raise the voltage at node E with little or no current flowing in the amplifier 41. Amplifiers 43 and 44 shift the voltage level at point E down to point F to the required biased level for the amplifier 46. Normally, amplifiers 45 and 46 are biased such that for no light, the voltage at point G is low and a drain current flows through amplifier 46. This condition exists when no light is directed on the element 20.

When light is directed on element 20, nodes A and B fall towards the anode voltage connected to the element 20. Point C follows A by a threshold voltage when point C goes down, the drain current in the amplifier 37 decreases causing the gate-to-source voltage of element 38 to decrease causing point D to rise. When point D rises, the drain current of element 41 increases to cause the gate to source voltage of element 42 to increase and point E falls. As point E falls, point F follows and causes the drain current of element 46 to decrease, which decreases the gate-to-source voltage of element 45, causing point G to rise.

Thus, with no light, point E is forced to a threshold below the supply voltage of V1, typically +8.0 volts. Point E, therefore, fixes the Up level of the gate of the element 46. With light, point F is forced well below the threshold voltage of element 46. Point F clamps the low level which has an effect on the output. The result is a $\Delta V$, that is required at point B, to cause the output to switch from a low value to a high value.

Figure 5:
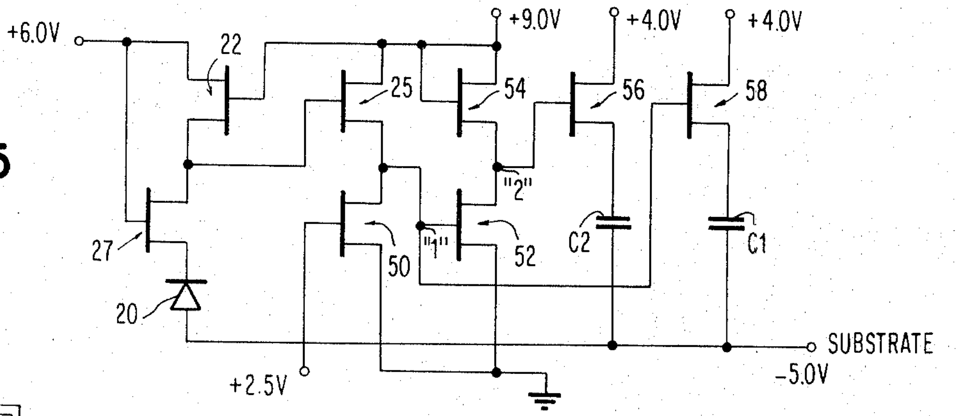
FIG. 5 is an electrical schematic of the circuit of FIG. 2 adapted to provide an output signal independent of background or contrast and requiring low standby source.

A photo detector amplifier cell that provides output signals independent of changes in background light or contrast is shown in FIG. 5. Elements in FIG. 5 corresponding to those in FIG. 2 have the same reference designations. The circuit of FIG. 5 also reduces the standby current or circuit power dissipation when element 20 is in a non-conducting condition or dark environment. As the background light slowly changes in an upward or downward direction and over a relatively long period of time (compared to the time when a character is scanned in a document) a voltage build-up or decrease occurs on capacitors C2 or C1. The voltage across the capacitors increases as the background light increases. When the background light decreases, the voltage across the capacitor also decreases. The change in background light usually occurs from a change in the color of a document being scanned. The change in the color causes the photo element to set a different steady state level. When the voltage on the capacitor C2 and C1 is stabilized, current flow through amplifiers 56 and 58 respectively terminates. The sudden change in the background, as for example, when a character is present in a document being scanned, causes an AC signal to be developed by the photo element 20. The inverter 25 in conjunction with an amplifying element 50 adjusts the voltage level for application to a set of inverters 52 and 54. The output of the amplifiers is also provided to an amplifying element 58 which is connected to the capacitor C1. The AC signal appearing at the output of the elements 25 and 50 causes amplifying elements 56 or 58 to conduct. The element 58 conducts when a light increase is sensed by the photo diode. The amplifying element 56 conducts when the photo cells detect a decrease in light. In the absence of any sudden change in light sensed by the photo cell, the voltage build up on the capacitor C2 and C1 terminates current flow through the amplifiers 56 and 58. The circuit of FIG. 5, therefore, provides a pure AC signal proportional to the sudden change in light sensed by a photo diode, as for example, when a character is sensed in a document. The AC signal is not affected by the background light which is represented by a DC level that is removed by the capacitor C2 and C1. Standby current required for the amplifiers 56 and 58 is eliminated by the voltage build up on the capacitors C2 and C1 when the photo diode is not sensing a character. The elimination of current flow in the elements 56 and 58 significantly reduces the power dissipation of the circuit.

Referring to FIGS. 6*a* and 6*b*, the semiconductor member 23 is shown incorporating the circuit of FIG. 2. The load resistor R1, however, is not shown in FIGS. 6*a* and 6*b*, but may be incorporated by well known designs and processes. The member 21 is a silicon substrate having a P type conductivity, i.e., boron and a resistivity of 2 ohm centimeter. A planar process utilizing photolithographic masking and silicon dioxide is employed to achieve drain and source electrodes. A phosphorous diffusant is used to form the N type drain (31) and source electrodes (33). The electrode 33 includes the light sensitive element 20. Typically, the junction depth is of the order of 2 microns. A gate oxide 23 is formed between the drain and source electrodes by conventional processes. Typically, the thickness of the gate oxide is of the order of 700A. The oxide thickness outside the gate region is of the order of 6,000A. After openings are made in the oxide covering the drain and source electrodes, metallization 29 is deposited to form contacts and interconnecting circuitry. Typically, the metallization is aluminum although other metallurgy may be utilized. Photolithographic masking processes are used to form the interconnecting metal bonds 29. Further details for fabricating field effect transistor detectors cells are described in U.S. Pat. No. 3,390,273, issued June 25, 1969.

The circuits of FIGS. 3, 4 and 5 may also be incorporated in a semiconductor member in a manner similar to that described for FIGS. 6*a* and 6*b*. The capacitor may be formed in a manner described in U.S. Pat. No. 2,981,877. Also, while a silicon substrate has been described, it is apparent that other groups III and V material may be substituted, as for example, gallium arsenide.

While this invention has been particularly shown and described with reference to the preferred embodiment, it will be understood by those skilled in the art that the foregoing and other changes in form and detail may be made therein without departing from the spirit and scope of the invention.

What is claimed is:

1. An opto-electronic circuit comprising:

a. a light sensitive element, an FET of one type buffer amplifier connected to the light sensitive element and a circuit node, b. an FET of one type as a linear load element connected to the node, c. an FET of said one type as a high input impedance level shifter connected to the node, d. an output circuit including a terminal, e. and at least one inverter amplifier circuit connected between the level shifter and the output circuit to set the terminal between two voltage levels depending upon the presence or absence of light incident on the light sensitive element.

2. The circuit of claim 1 wherein the high input impedance level shifter comprises first and second FET amplifiers connected in series and having an output at the common connection between the amplifiers.

3. The circuit of claim 2 wherein the inverter amplifier circuit comprises at least two FET amplifiers connected in series, an input circuit connected to one amplifier and an output at the common connection between the amplifiers.

4. The circuit of claim 3 wherein the output circuit comprises at least two FET amplifiers connected in series, an input circuit connected to one amplifier and having the terminal connected to the common connection between the amplifiers.

5. The circuit of claim 4 wherein the level shifter is adapted to lower the voltage level at the node to the bias voltage level for the connected inverter amplifier.

6. The circuit of claim 5 wherein a second inverter amplifier and second level shifter are connected in cascade between the output circuit and the first inverter amplifier, the second level shifter adapted to lower the output voltage at the first inverter amplifier to the bias voltage level for the output circuit.

7. An opto-electronic circuit comprising:

a. a light sensitive element, an FET of one type buffer amplifier connected to the light sensitive element and a circuit node, b. an FET of said one type as a linear load element connected to the light sensitive element at the node, c. an FET of one type as a high impedance level shifter connected to the node, d. first and second output circuits, e. and at least one inverter-amplifier connected between the level shifter and one output circuit, the level shifter and inverter adapted to cause current to flow in one output circuit when a decrease occurs in light incident on the light sensitive element and to terminate when an increase occurs in the light incident on the light sensitive sensitive which causes current to flow in the second output circuit.

8. The circuit of claim 7 further including storage elements adapted to reduce standby current through the output circuits when the light sensitive element is not subject to sudden changes in light.

9. The circuit of claim 8 wherein each output circuit includes an amplifier element, the amplifiers being biased to follow the background light incident on the light sensitive element and conducting for sudden changes in light.

10. The circuit of claim 9 wherein each output circuit has an amplifying element connected to an energy storage device, one output circuit being connected to the inverter-amplifier and the other output circuit being connected to the level shifter.

11. An integrated opto-electronic circuit comprising:

a. a semiconductor substrate, b. a light sensitive element formed in the substrate of an active device, c. a first amplifying element formed in the substrate as an active device to serve the light sensitive element as a linear load, d. at least second and third amplifying elements formed in the substrate as active devices to serve the first amplifying elements as a high input impedance voltage level shifter, e. at least fourth and fifth amplifying elements formed in the substrate as active elements to serve the voltage level shifter and a polarity shifter, f. at least six and seventh amplifying elements together with at least two storage elements formed in the substrate as active and passive devices, respectively, to serve the level shifter and polarity shifter as output circuits, g. an insulating layer formed on the substrate and covering all active and passive devices, the layer including openings to the active and passive devices, h. and metallization deposited on the layer and in the contact openings to connect the devices in an electric circuit, that when biased, causes the first amplifier to be at a threshold and without thermal noise, such that when light is present, the output circuit will follow the background and provide an output signal that is analogous to sudden increases and decreases in the light incident on the photosensitive element.

* * * * *